(12) United States Patent
Chittipeddi et al.

(10) Patent No.: US 6,500,729 B1
(45) Date of Patent: Dec. 31, 2002

(54) METHOD FOR REDUCING DISHING RELATED ISSUES DURING THE FORMATION OF SHALLOW TRENCH ISOLATION STRUCTURES

(75) Inventors: Sailesh Chittipeddi, Allentown, PA (US); Arun Kumar Nanda, Orlando, FL (US); Ankineedu Velaga, Orlando, FL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/586,384

(22) Filed: Jun. 2, 2000

(51) Int. Cl.[7] .................................................. H01L 21/76
(52) U.S. Cl. ........................ 438/431; 438/430; 438/425
(58) Field of Search ................................ 438/430, 431, 438/432, 425

(56) References Cited

U.S. PATENT DOCUMENTS

| | | | |
|---|---|---|---|
| 5,116,779 A | | 5/1992 | Iguchi |
| 5,189,501 A | | 2/1993 | Kawamura et al. |
| 5,376,222 A | * | 12/1994 | Miyajima et al. ............ 156/636 |
| 5,872,045 A | * | 2/1999 | Lou et al. .................... 438/432 |
| 5,981,394 A | * | 11/1999 | Ohashi et al. ............... 438/692 |
| 6,022,789 A | * | 2/2000 | Takase ........................ 438/430 |
| 6,136,664 A | * | 10/2000 | Economikos et al. ....... 438/431 |
| 6,191,003 B1 | * | 2/2001 | Lin et al. .................... 438/431 |
| 6,303,461 B1 | | 10/2001 | Chen et al. |
| 6,329,261 B1 | | 12/2001 | Kishimoto |

\* cited by examiner

*Primary Examiner*—Trung Dang
(74) *Attorney, Agent, or Firm*—Christie, Parker & Hale, LLP

(57) ABSTRACT

A method for forming shallow trench isolation structures produces a shallow trench isolation structure having a substantially planar upper surface. The shallow trench isolation structure is formed from an originally formed shallow trench isolation structure which includes a deposited dielectric material within a trench and which exhibits dishing related problems in the form of a void formed within the trench, wherein the surface of the deposited dielectric material is recessed below the planar upper surface. The method provides for filling the void with a silicon film. The silicon film is then polished in its as-deposited or oxidized form, to produce a shallow trench isolation structure having a planar upper surface.

19 Claims, 2 Drawing Sheets

METHOD FOR REDUCING DISHING RELATED ISSUES DURING THE FORMATION OF SHALLOW TRENCH ISOLATION STRUCTURES

TECHNICAL FIELD

The present invention relates most generally to semiconductor devices and methods for forming the same. More particularly, the present invention relates to a method for forming shallow trench isolation structures.

BACKGROUND OF THE INVENTION

In today's advancing semiconductor manufacturing processing technology, the multitude of components which combine to form an integrated circuit device are being formed in increasingly closer proximity. In order to avoid adjacent devices from shorting to one another, and in order to avoid leakage between devices formed in close proximity to one another, shallow trench isolation (STI) structures have become a commonly used feature in the semiconductor manufacturing industry.

The process for forming an STI structure typically involves forming a trench-like opening in a silicon substrate, then filling the trench opening with an insulating material. The insulating materials may be formed by deposition techniques such as low pressure chemical vapor deposition (LPCVD), high density plasma (HDP) deposition, or any other suitable method for depositing an insulating material within a trench opening. After the opening is filled with a deposited insulating material, a planarizing process such as chemical mechanical polishing (CMP) is used to planarize the surface by removing any portions of the insulating material which may be formed above the upper plane beneath which the trench opening extends.

Nitride (silicon nitride—$Si_3N_4$) or other oxidation resistant, and suitably hard films, are typically used as hard masks for trench-formation silicon etches and also as polishing stop layers for CMP operations. In this manner, the to nitride or other, hard, oxidation-resistant film forms the upper surface beneath which the trench opening extends. Hard films are favored because of their resistance as well as selectivity during the polishing operations used to planarize the STI structures. Such films have relatively low removal rates and may be referred to as polishing stop layers.

During the formation of STI structures, problems arise when the polishing operations used to polish the insulating material and planarize the STI structure, cause "dishing" on the top of the STI structure. Dishing describes the phenomena wherein the top surface of the insulating material within the trench, becomes recessed below the upper surface of the polishing stop layer such as silicon nitride. Typically, the central portion of the top surface of the STI structure is recessed below the peripheral portion of the top surface of the STI structure. The peripheral edges of the STI structure generally extend up the side of the trench opening to intersect the upper surface of the polishing stop layer at the edges of the trench opening. Sharp, upward projections of the insulating material may therefore result at these peripheral edges. The central portion of the top surface of the STI structure may be recessed by as many as 500 angstroms with respect to the edges of the STI structure. After the nitride polishing-stop layer is subsequently removed and the entire top portion of the STI structure uniformly recessed, the 500 angstrom height difference on the top of the STI structure, remains.

After the STI structure is completed, the sharp, upward projections may remain at the edges of the STI structure which may additionally extend above the upper surface of the semiconductor substrate. These projections may extend above the bulk of the STI structure by as much as 500 angstroms, and may extend above the surrounding semiconductor substrate by an even greater distance. Polysilicon films are commonly used to form transistor gates and to serve other interconnection functions in semiconductor integrated circuits. At the location where the polysilicon film extends over the sharp upward projections created at the peripheries of STI structures due to dishing, a localized electric field is created. Such a localized electric field is highly undesirable as it may produce various electrical parametric problems throughout the device. For example, such an electric field formed in a transistor gate may lower the threshold voltage, $V_t$, for a MOSFET (Metal Oxide Semiconductor Field Effect Transistor) device. These sharp upward projections in the STI structure created by dishing can cause other electrical problems which may result in device failure, or which may require additional implants to compensate for changed parametric characteristics, or both.

It can therefore be seen that there is a need for a process for forming shallow trench isolation structures having planar upper surfaces and which do not have sharp projections which extend upward and can create localized electric fields.

SUMMARY OF THE INVENTION

To achieve these and other objects, and in view of its purposes, the present invention addresses the shortcomings of the processes for forming shallow trench isolation structures known to the prior art and provides an improved process for forming superior shallow trench isolation structures. The present invention describes materials, processes, and structures used to produce low leakage STI structures having substantially planar upper surfaces. The present invention provides a method for filling the voids created due to dishing. The voids are filled by a silicon-containing film which, in its as-deposited or oxidized form, provides a material having polishing characteristics which are similar to those of the film used as the polishing-stop layer. After the voids are filled, a subsequent polishing step is used to form a substantially planarized upper surface of the shallow trench isolation structure. Such a planarized structure results because the polishing rate of the silicon film or oxidized silicon film is much more similar to that of the polishing-stop layer than was the polishing rate of the dielectric material originally formed within the trench opening. The production of shallow trench isolation structures having planar upper surfaces eliminates the subsequent formation of localized electric fields and therefore produces devices which are less prone to leakage and other parametric failures.

It is to be understood that both the foregoing general description and the following detailed descriptions are exemplary, but not restrictive of the invention.

BRIEF DESCRIPTION OF THE DRAWING

The invention is best understood from the following detailed description when read in connection with the accompanying drawing. It is emphasized that, according to common practice, the various features of the drawing are not to-scale. On the contrary, the dimensions of the various features are arbitrarily expanded or reduced for clarity. Included in the drawing are the following figures.

DETAILED DESCRIPTION OF THE INVENTION

The present invention provides a method for solving dishing related issues which occur during the formation of shallow trench isolation (STI) structures. More specifically, after dishing occurs when planarizing an STI structure according to conventional methods, the present invention provides a method for filling the void created by dishing, then planarizing the STI structure without causing any further dishing. The STI structure formed according to the present invention has a substantially planar upper surface. After subsequent processing operations have been carried out to remove the polishing stop layer-commonly a silicon nitride film, and the upper surface of the STI structure is recessed as a result of operations which attack oxides, the resulting structure is free of sharp edges which project upward and which can cause undesirable localized electric fields in semiconductor materials such as polysilicon which are formed above the STI structures. Without such localized electric fields which can adversely affect device electrical parameters, and which can also destroy device functionality, high yielding semiconductor devices are produced.

Figure 1:
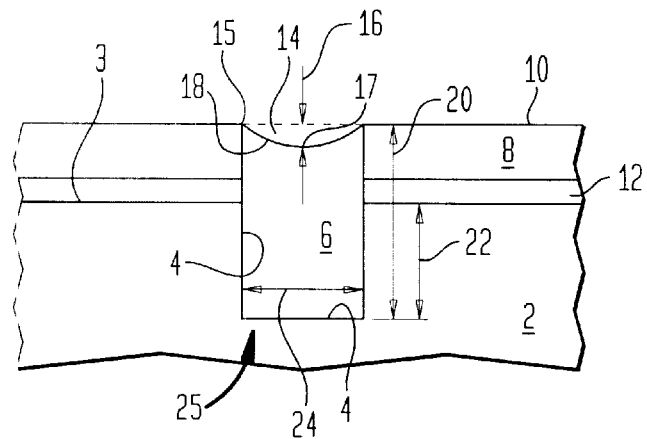
FIG. 1 is a cross-sectional view showing dishing produced in a polished STI structure.

FIG. 1 shows an example of a shallow trench isolation structure which exhibits dishing prior to being subjected to the method of the present invention. The structure shown in FIG. 1 is presented to demonstrate the dishing issues associated with STI structures which are formed by polishing methods such as chemical mechanical polishing. Dishing results because the deposited dielectric material which fills the trenches, has a higher polishing rate than the polishing stop layer used. These deposited dielectric materials are typically formed by any of various chemical vapor deposition (CVD) techniques. In order to ensure complete removal of the deposited dielectric material from over the polishing stop layer, a sufficient amount of polishing is used which recesses the upper surface of the deposited dielectric, within the trench and below the surface of the polishing stop film. It should be emphasized at this point that the particular details of the embodiment shown are intended to be exemplary only. Any STI structure formed by CMP or other polishing methods and which exhibits dishing can similarly be planarized by the method of the present invention to reduce the irregular top surfaces including sharp edges, of the finally produced STI structure.

In the exemplary embodiment shown in FIG. 1, shallow trench isolation structure 25 is formed within trench opening 4 which extends down from upper surface 10, through polishing stop layer 8, through pad oxide film 12, and into semiconductor substrate 2. In an exemplary embodiment, trench opening 4 may be formed by an etching operation which etches in succession polishing stop layer 8 and pad oxide film 12, thereby removing these films, and which continues to etch the trench opening 4 which extends into substrate 2. Conventional etching methods may be used. In an exemplary embodiment, semiconductor substrate 2 may be a silicon wafer as commonly used in the semiconductor manufacturing industry. In an exemplary embodiment, pad oxide film 12 may be a thermally grown silicon dioxide, or "oxide", film having a thickness ranging from 50 to 200 angstroms, but other pad oxide films having different thicknesses may be used alternatively.

Polishing stop, or upper layer 8 will be a silicon nitride film according to the preferred embodiment, but other oxidation resistant films which are relatively hard and resistant to polishing, may be used in alternative exemplary embodiments. Upper layer 8 will be chosen to have a low polishing rate, or high polishing resistance, for the polishing conditions used. Although upper layer 8 may a be film other than silicon nitride in various alternative embodiments, hereinafter upper layer 8 will be referred to as silicon nitride, or simply nitride film 8. Nitride film 8 may include a thickness within the range of 1000 to 2500 angstroms. In an exemplary embodiment, the total thickness of pad oxide film 12 and nitride film 8 may range from 1600 to 2000 angstroms. In an exemplary embodiment, trench depth 20 of trench opening 4 may be on the order of 3500 to 6500 angstroms.

Trench opening 4 is formed by etching, as above, and is formed prior to the formation of STI structure 25. Trench opening 4 may extend down into semiconductor substrate 2 by a depth 22 ranging from 2500 to 3500 angstroms according to various exemplary embodiments. Trench width 24 of trench opening 4 may be 0.1 microns or greater and in the preferred embodiment may be 0.1 to 0.5 microns. In a preferred embodiment, trench depth 20 and trench width 24 will be chosen so that the aspect ratio, defined as [trench depth 20: trench width 24] will not exceed 6.0.

STI structure 25 is formed by depositing a film of dielectric material 6 over top surface 10 of nitride film 8, and also within and filling trench opening 4. The film of dielectric material 6 will commonly be an oxide film formed by any of various CVD methods. According to an exemplary embodiment, not shown, prior to the formation of dielectric material 6, a thermally grown oxide layer having a thickness ranging from 100 Å–300 Å, may additionally be grown on the inner surfaces of trench opening 4 to cure any etch defects and to prevent defects which may be caused by subsequent cleaning processes.

CMP or other polishing techniques are used to remove portions of dielectric material 6 which are formed above the plane formed by top surface 10 of nitride film 8. In order to ensure that the dielectric material 6 is completely removed from over top surface 10, the polishing technique is carried out to a point which may include slightly receding top surface 10 of nitride film 8. Nitride film 8 is chosen for its relative hardness and therefore resistance to being removed by polishing. Dielectric material 6 which fills the trench, includes a higher polishing rate than nitride film 8. This difference is more pronounced when dielectric material 6 is formed by means other than a high density plasma CVD. As such, after a CMP or other polishing technique is used to planarize the structure by removing portions of dielectric material 6 from over top surface 10, dishing results.

Dishing may be described as the recession of portions of the STI structure within the trench in which it is formed. Top surface 18 is recessed with respect to top surface 10 of nitride film 8. The void produced within this recessed region is shown as void area 14. It can also be seen that top surface 18 of STI structure 25 is at a lower point 17 towards the center of STI structure 25, than it is at edge 15 of the STI structure 25. STI structure 25 therefore exhibits a raised peripheral portion. Void area 14 is therefore formed within trench 4 and above STI structure 25 and represents an unfilled area of trench 4 existing below the plane formed by top surface 10 of nitride film 8. Maximum depth 16 of void area 14 may be on the order of 500 angstroms or greater. Sharp upward projections result at edges 15 of STI structure 25 within trench 4. The present invention is directed to filling, then planarizing this void area in a manner which avoids dishing in subsequent planarization steps. It should be understood at this point, that the sharp upward projections shown at the edges of the STI structure are intended to be exemplary, but not restrictive of the surface irregularities which result due to dishing.

Figure 2:
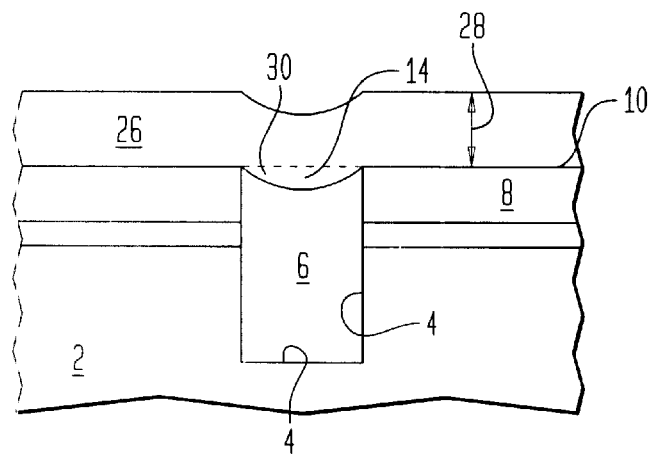
FIG. 2 is a cross-sectional view showing the structure shown in FIG. 1 after the addition of a silicon-containing film.

FIG. 2 shows silicon film 26 formed over top surface 10 and filling former void area 14 within trench opening 4. Silicon film 26 may be a polysilicon or amorphous silicon film and may be formed by conventional methods. Silicon film 26 may be a doped or undoped film. Silicon film 26 includes cap portion 30 which fills former void area 14. Silicon film 26 may include a thickness ranging from 500 to 2500 angstroms, but various other thicknesses may be used alternatively, provided silicon film 26 fills void area 14 shown in FIG. 1.

Figure 3A:
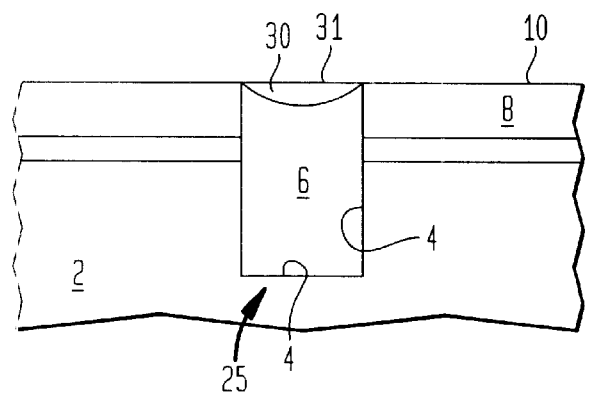
FIG. 3A is a cross-sectional view showing the structure in FIG. 2 after it has been planarized by polishing according to a first exemplary embodiment.

FIG. 3A shows the following step in the processing sequence according to a first exemplary embodiment of the present invention. Silicon film 26 (shown intact in FIG. 2) is removed from over top surface 10 of nitride film 8 by CMP or other means. Cap portion 30 remains in trench opening 4 and fills former void area 14. Silicon film 26 (shown intact in FIG. 2) includes a polishing rate which is similar to that of nitride film 8. Silicon film 26 has a polishing rate more similar to that of nitride film 8, than that of dielectric material 6. Therefore, is dishing is prevented during this polishing procedure. Polished STI structure 25 now includes substantially planar top surface 31 which is substantially coplanar with top surface 10 of nitride film 8.

Figure 4:
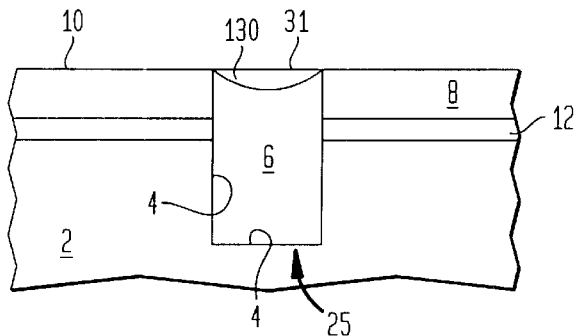
FIG. 4 is a cross-sectional view showing a substantially planar STI structure produced according to each of the first and second exemplary embodiments.

FIG. 4 shows the STI structure shown in FIG. 3A, after a thermal oxidation procedure has been carried out to oxidize cap portion 30 of silicon film 26 shown in FIG. 3A. The oxidation procedure carried out may be a rapid thermal anneal (RTA) or a furnace oxidation procedure. Oxidation temperatures may range from 550° C. to 1100° C. according to various exemplary embodiments. Oxidation times may range from 30 seconds to 5 minutes for RTA oxidation, and may range from 30 minutes to 2 hours for furnace thermal oxidation procedures. During the oxidation procedure, cap portion 30 shown in FIG. 3A is converted to silicon dioxide, or oxide cap 130. It can be seen that STI structure 25 completely fills trench opening 4 and includes dielectric material 6 and oxide cap 130. STI structure 25 includes substantially planar top surface 31 being substantially coplanar with top surface 10 of nitride film 8.

Figure 3B:
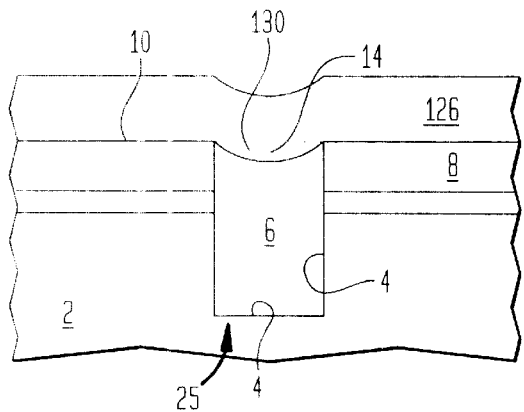
FIG. 3B is a cross-sectional view showing the structure in FIG. 2 after the silicon-containing film has been oxidized according to a second exemplary embodiment.

According to a second exemplary embodiment of the present invention, FIG. 3B shows a subsequent step in the processing sequence performed upon the structure shown in FIG. 2. According to the second exemplary embodiment, the structure shown in FIG. 2 is oxidized according to oxidation techniques described in conjunction with FIG. 4. This oxidation procedure converts silicon film 26, shown in FIG. 2, to oxide film 126 as shown in FIG. 3B. Oxide film 126 includes cap portion 130 which occupies upper portion of trench opening 4 which had previously been void area 14 as shown in FIG. 1. Oxide film 126, formed by thermally oxidizing a silicon film, has polishing characteristics more similar to those of nitride film 8, than those of the dielectric material 6 formed by CVD means. Oxide film 126 includes a polishing rate similar to that of nitride film 8. As such, when the structure shown in FIG. 3B is subjected to polishing by means of CMP or other techniques, the planarized structure shown in FIG. 4 results. The structure shown in FIG. 4 is as previously described and when formed according to this second exemplary embodiment also includes cap portion 130 and substantially planar top surface 31 which is substantially coplanar with top surface 10 of nitride film 8.

Figure 5:
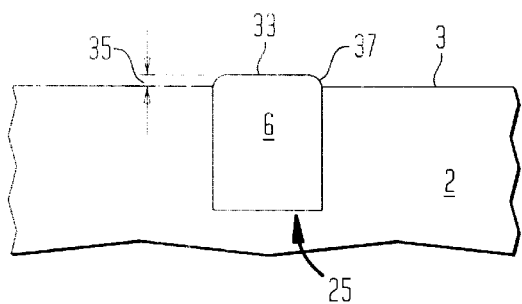
FIG. 5 is a cross-sectional view showing the STI structure shown in FIG. 4, after it has been recessed.

An aspect and advantage of the present invention is that STI structure 25 shown in FIG. 4 includes a substantially planar upper surface 31. Dishing is avoided. When subsequent processing operations are carried out using conventional means to remove nitride film 8 and subjacent pad oxide film 12, upper surface 31 of STI structure 25 may become recessed during the removal operations, but will remain substantially planar. FIG. 5 shows STI structure 25 after various conventional procedures have been performed to remove nitride film 8, and pad oxide film 12 shown in FIG. 4. In an exemplary embodiment, nitride film 8 may be removed by etching in hot phosphoric acid at a temperature exceeding about 160°, and pad oxide film 12 may be subsequently etched using hydrofluoric acid. Prior to the removal of nitride film 8, a conventional deglazing procedure may optionally be carried out to remove any trace amounts of oxide from over nitride film 8, according to common methods.

It can be seen that STI structure 25 includes upper surface 33 which may extend above top surface 3 of substrate 2 by a distance 35 which may be on the order of 50 to 500 angstroms, depending on the original thicknesses of films 8 and 12 and the techniques used to remove them. In alternative embodiments, distance 35 may take on other values, including zero. Upper edges 37 of STI structure 25 may be generally orthogonal or rounded as a result of the processing operations used to remove films 8 and 12. It can be seen that upper edges 37 do not include sharp upward projections and the periphery of upper surface 33 is not raised relative to the center of upper surface 33. Upper surface 33 is substantially planar. An advantage of the present invention is that a subsequently formed polysilicon or other semiconductor film will not be prone to localized electric field effects when the film extends over the STI structure shown in FIG. 5.

Figure 6:
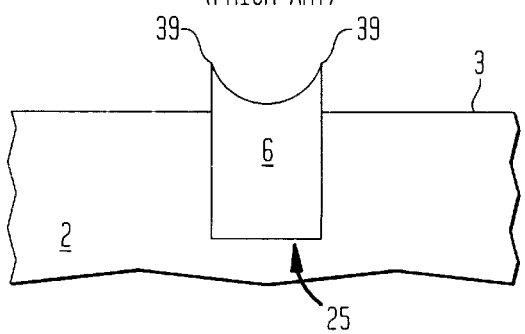
FIG. 6 is a cross-sectional view presented for comparative purposes, and shows an STI structure according to the prior art and which includes undesired sharp edges projecting above the substrate surface.

FIG. 6 is shown for comparative purposes only and illustrates STI structure 25 formed using prior art methods and which includes sharp upward projections 39 at the edges of STI structure 25. When a subsequently formed polysilicon or other semiconductor film is formed over the prior art STI structure shown in FIG. 6 and which is not formed according to the present invention, undesired local electric fields will form at the locations where the polysilicon or other semiconductor film (not shown) extends over raised projections 39 formed at the upper edges.

It should be emphasized at this point that the present invention is directed to providing a method to overcome dishing effects produced when shallow trench isolation structures are formed using conventional polishing techniques for planarizing a deposited dielectric film formed within a trench opening. The methods of the present invention may be applied to various other STI or other structures which include a dielectric material formed within a trench and having an upper surface recessed below the surface within which it is formed.

The preceding merely illustrates the principles of the invention. It will thus be appreciated that those skilled in the art will be able to devise various arrangements which, although not explicitly described or shown herein, embody the principles of the invention and are included within its spirit and scope. For example, the method of the present invention can be used to correct dishing related problems which occur when any of various other devices are formed within a trench opening by polishing techniques. Furthermore, dishing can cause surface irregularities in the STI structure, other than the sharp edges shown.

All examples and conditional language recited herein are principally intended expressly to be only for pedagogical purposes and to aid the reader in understanding the principals of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents such as equivalents developed in the future, i.e., any elements developed that perform the same function, regardless of structure. The scope of the present invention, therefore, is not intended to be limited to the exemplary embodiments shown and described herein. Rather, the scope and spirit of the present invention is embodied by the appended claims.

What is claimed:

1. A method for forming a shallow trench isolation structure, comprising the steps of:
   (a) providing a substrate having an upper surface formed of a first material and an opening extending down from said upper surface, said opening partially filled with a dielectric material and including a void area beneath an upper plane formed by said upper surface;
   (b) depositing a silicon film over said upper surface and completely filling said void area;
   (c) thermally oxidizing said silicon film thereby converting said silicon film into a silicon dioxide film; and
   (d) removing portions of said silicon dioxide film from above said upper plane.

2. The method as in claim 1, in which said step (d) includes producing a cap portion of said silicon dioxide film which remains in and fills said void area, said cap portion having a top surface being substantially coplanar with said upper surface.

3. The method as in claim 1, wherein said first material comprises silicon nitride.

4. The method as in claim 1, wherein said step (b) comprises depositing one of a polycrystalline silicon film and an amorphous silicon film.

5. The method as in claim 1, wherein said step (d) comprises chemical mechanical polishing.

6. The method as in claim 1, wherein said step (c) comprises one of rapid thermal annealing and furnace oxidation at a temperature within the range of 550° C. to 1100° C.

7. The method as in claim 1, wherein said dielectric material is formed by chemical vapor deposition.

8. The method as in claim 1, in which said step (a) includes providing a semiconductor substrate having said first material formed thereover, said opening extending through said first material and extending into said semiconductor substrate by a depth ranging from 2500 angstroms to 3500 angstroms.

9. A method for forming a shallow trench isolation structure, comprising the steps of:
   providing a semiconductor substrate having a first material formed thereover and forming an upper surface thereof;
   etching an opening through said first material and extending down from said upper surface and into said semiconductor substrate;
   depositing a film of dielectric material over said upper surface and filling said opening;
   removing portions of said film of said dielectric material from over said upper surface and recessing an upper level of said dielectric material within said opening and below an upper plane formed by said upper surface, thereby forming a void area beneath said upper plane and within said opening;
   depositing a silicon film over said upper surface and filling said void area;
   thermally oxidizing said silicon film thereby converting said silicon film into a silicon dioxide film; and
   removing portions of said silicon dioxide film from above said upper plane.

10. The method as in claim 9, wherein said first material comprises silicon nitride and is formed on a further silicon dioxide film formed on said semiconductor substrate and said step of etching includes etching said opening through said further silicon dioxide film.

11. The method as in claim 9, in which said step of removing includes chemical mechanical polishing.

12. The method as in claim 1, further comprising step (e) removing said first material.

13. A method for forming a shallow trench isolation structure comprising the steps of:
   (a) providing a substrate having an upper surface formed of silicon nitride and an opening extending down from said upper surface, said opening partially filled with a dielectric material and including a void area beneath an upper plane formed by said upper surface;
   (b) depositing a silicon film over said upper surface and completely filling said void area;
   (c) removing a first portion of said silicon film from over said upper plane thereby producing a second portion of said silicon film remaining in and completely filling said void area; and
   (d) oxidizing said second portion of said silicon film, thereby converting said second portion of said silicon film into a silicon dioxide material.

14. The method as in claim 13, in which said step (c) includes said second portion having a top surface being substantially coplanar with said upper surface.

15. The method as in claim 13, wherein said step (c) comprises chemical mechanical polishing.

16. The method as in claim 13, in which said step (a) includes providing a semiconductor substrate having said first material formed thereover, said opening extending through said first material and extending into said semiconductor substrate by a depth ranging from 2500 angstroms to 3500 angstroms.

17. The method as in claim 13, wherein said step (a) comprises the steps of:
   (1) providing a semiconductor substrate having said first material formed thereover;
   (2) etching said opening through said first material and extending down into said semiconductor substrate;
   (3) depositing a film of said dielectric material over said upper surface and filling said opening; and
   (4) removing portions of said film of said dielectric material from over said upper surface and recessing an upper level of said dielectric material within said opening and below said upper plane thereby forming said void area.

18. The method as in claim 13, wherein said step (c) comprises one of rapid thermal annealing and furnace oxidation at a temperature within the range of 550° C. to 1100° C.

19. The method as in claim 13, wherein said dielectric material is formed by chemical vapor deposition.

* * * * *